(12) United States Patent
Carr

(10) Patent No.: US 8,910,490 B2
(45) Date of Patent: Dec. 16, 2014

(54) MODULE FOR USE IN DATA HALL INFRASTRUCTURE SYSTEM

(75) Inventor: Scott James Carr, Holder (AU)

(73) Assignee: Datapod (Australia) Pty Ltd, Sydney (AU)

( * ) Notice: Subject to any disclaimer, the term of this patent is extended or adjusted under 35 U.S.C. 154(b) by 417 days.

(21) Appl. No.: 13/379,024

(22) PCT Filed: Jun. 21, 2010

(86) PCT No.: PCT/AU2010/000767
§ 371 (c)(1),
(2), (4) Date: Mar. 23, 2012

(87) PCT Pub. No.: WO2010/148429
PCT Pub. Date: Dec. 29, 2010

(65) Prior Publication Data
US 2012/0176011 A1    Jul. 12, 2012

Related U.S. Application Data

(60) Provisional application No. 61/253,523, filed on Oct. 21, 2009.

(30) Foreign Application Priority Data

Jun. 23, 2009  (AU) ................................ 2009902882

(51) Int. Cl.
*E04H 5/02* (2006.01)
*E04H 1/12* (2006.01)
*H05K 7/14* (2006.01)
*E04H 5/00* (2006.01)

(52) U.S. Cl.
CPC ................ *E04H 5/02* (2013.01); *E04H 1/1238* (2013.01); *E04H 2005/005* (2013.01); *H05K 7/1497* (2013.01); *E04H 2001/1283* (2013.01)
USPC ........................................... 62/259.2; 62/498

(58) Field of Classification Search
CPC . E04H 1/1238; E04H 5/02; E04H 2001/1283; E04H 2005/005; H05K 7/1497
USPC .............. 62/115, 259.2, 259.1, 498; 312/236, 312/111, 237, 223.3
See application file for complete search history.

(56) References Cited

U.S. PATENT DOCUMENTS 7,278,273 B1   10/2007  Whitted et al.
7,861,543 B2 *  1/2011  Carlsen et al. .................. 62/150

(Continued)

FOREIGN PATENT DOCUMENTS

WO    2007139560 A1   12/2007
WO    2008033921 A2    3/2008

*Primary Examiner* — Mohammad M Ali
(74) *Attorney, Agent, or Firm* — Daniel Schein, Esq.

(57) ABSTRACT

A method of constructing a data hall utilizing a plurality of data hall modules, each data hall in the form of a container comprising a top, a bottom, a first pair of opposed sides and second pair of opposed sides, and at least one side of the first pair of opposed sides is open and has a removable panel. For the purpose of transportation, the panel is removably fixed to the open side, and during construction so the plurality of data hall modules are bayed in side-by-side relationship so that their open sides are adjacent to each other and/or in end-to-end relationship so that their open ends are adjacent to each other.

16 Claims, 16 Drawing Sheets

(56) References Cited

U.S. PATENT DOCUMENTS

| | | | |
|---|---|---|---|
| 7,963,118 B2* | 6/2011 | Porter et al. | 62/259.2 |
| 2003/0147216 A1* | 8/2003 | Patel et al. | 361/700 |
| 2004/0025515 A1* | 2/2004 | Evans | 62/3.2 |
| 2005/0225936 A1* | 10/2005 | Day | 361/687 |
| 2008/0041077 A1* | 2/2008 | Tutunoglu | 62/186 |
| 2008/0055846 A1 | 3/2008 | Clidaras et al. | |
| 2008/0094797 A1 | 4/2008 | Coglitore et al. | |
| 2008/0245083 A1* | 10/2008 | Tutunoglu et al. | 62/115 |
| 2009/0097205 A1* | 4/2009 | Matsushima et al. | 361/700 |
| 2009/0154096 A1* | 6/2009 | Iyengar et al. | 361/694 |
| 2009/0229194 A1 | 9/2009 | Armillas | |

\* cited by examiner

MODULE FOR USE IN DATA HALL INFRASTRUCTURE SYSTEM

TECHNICAL FIELD

The present invention relates to data hall modules and there use in constructing a data hall infrastructure system. In particular the present invention is described with reference to an embodiment including heat capture means that in use captures low grade heat emanating from IT equipment housed in a data hall, and using same to at least partially power chilling equipment via a thermal powered compressor (heat powered ejector chiller) to improve overall energy efficiency of the data hall infrastructure system.

BACKGROUND

Datacentres provide a controlled operating environment for Information and Communication Technology (ICT) equipment. The ever increasing demand for productivity gains achievable through ICT, and the continuous rapid improvement in processing and storage densities of ICT equipment, has made it increasingly difficult for legacy datacentre designs and construction practices to keep pace with the provision of space, power and cooling necessary to support ICT operations.

Traditionally, datacentres have been housed in conventional brick and mortar facilities that remain relatively static in terms of floor space capacity, power capacity and cooling capacity over their 15 to 20 year life spans. Expanding the space, power and cooling capacity of legacy datacentres often requires lengthy building development applications and approvals, custom engineering and site-specific construction projects involving expensive skilled contractors.

Datacentres are typically constructed to be initially oversized so that capacity requirements can grow into the facilities. This is "capital expenditure" inefficient. It is also operationally inefficient because of the need to cool (control the environment) for a large area.

Modern datacentre facilities, require specialised expertise that is not readily available from the general construction industry. Today's datacentres now need to be able to rapidly expand (or contract) their floor space capacity, power supply capacity or cooling capacity or a combination of all of these to optimally support dynamic ICT requirements.

Datacentre infrastructure is typically categorised into one of two categories, namely "ICT Infrastructure" or "Site Infrastructure". ICT infrastructure is use to perform operations such as data transfer, manipulation and processing and includes equipment such as computer server equipment, data storage equipment and data communication equipment. Site Infrastructure includes all the supporting plant and equipment such as Uninterruptible Power Supplies (UPS), Power Distribution Units (PDU), back-up generators, Computer Room Air Conditioning (CRAC), chillers, cooling towers, fire detection and suppression equipment and general lighting.

Attempts have been made to utilise portable modular units, some the size of ISO shipping containers as datacentre modular units. Some examples of these include International Publications WO2007/139560(Google, Inc.) and WO2008/033921(Sun Microsystem, Inc) and US Patent Appln publication No. 2008/0094797(Cogliotore et al.).

Attempts have been made to retrofit standard ISO shipping containers. This provides a less than optimal solution in many circumstances. The internal air temperature of a standard intermodal shipping container that is exposed to the sun can rise significantly. If a standard intermodal shipping container were used to house ICT equipment, then a considerable amount of energy would be required to condition the air temperature resulting from exposure to the sun.

Previous attempts to containerise datacentre facilities have failed to deliver a system that provides an expandable floor space for the "data hall". In this specification "data hall" is the area in which ICT infrasrtucture/hardware is housed.

While the majority of ICT infrastructure can be installed into a standard 19-inch rack, some equipment does not. Therefore it is important that if containerised units are used for the purpose of a "data hall", it is advantageous to be able to expand floor space to accommodate all varieties of ICT equipment, otherwise containerised systems will be limited in their application.

In existing prior art datacentres, cooling and humidifying surplus space is very inefficient and therefore removing surplus floor space is likely to be an important energy efficiency strategy for datacentres of the future.

In the prior art, attempts to containerise datacentre facilities have tended to focus on cramming IT infrastructure into shipping containers, and have given little or inadequate consideration to important "Site Infrastructure" elements and general environmental considerations. Previous attempts have failed to deliver a complete "Site Infrastructure" solution. Prior art containerised solutions still require a substantial amount of custom engineering and on-site project effort to deploy the solution, and so do not fully realise the benefits associated with prefabrication and assembly line manufacturing.

A comprehensive system that includes all necessary datacentre "Site Infrastructure" components in the form of prefabricated, factory assembled modules in the form of "data hall modules" will minimize (or eliminate) complexity and costs associated with large construction projects. However, it is necessary that a comprehensive system exist, otherwise a large construction project will still be required to fill the gaps, and the advantages of prefabrication will be diluted.

A comprehensive Site Infrastructure approach to containerised datacentres gives rise to better overall energy utilisation and management practices. Waste energy in one part of the Site Infrastructure solution may be harnessed to do useful work in another part of the Site Infrastructure solution. A complete site infrastructure solution also gives rise to better overall energy management, enabling end-to-end energy monitoring and control system to achievable real time optimisation of energy usage.

It is also proposed to utilise containerised datacentres (or data hall modular units) to include site infrastructure such as specialised "chiller equipment", with the aim of developing a complete containerised infrastructure solution for datacentres.

A conventional electric chiller operates on the heat pump principle, where heat is removed from the datacentre and dumped to the outside air. On hot days, the surrounding air is often warmer than the desired temperature for the datacentre cabinets, so heat must be "pumped" using external energy, usually electricity.

A heat pump works by circulating a refrigerant fluid in a closed circuit, through an evaporator, a pump (compressor), a condenser and an expansion valve. The configuration of a prior art "conventional electric chiller" is shown in FIG. 14. The various temperatures of the refrigerant fluid shown at different locations of the circuit in FIG. 14 are for example purposes only and may vary.

Heat is absorbed (i.e. cooling effect is produced) in the evaporator 4 by the evaporation of a refrigerant fluid at low pressure. The refrigerant vapour is then compressed by an electric pump (compressor) 6 to higher pressure and temperature, consuming electricity. In addition to the heat absorbed by evaporator 4, most of the energy consumed by compressor 6 also ends up in the compressed refrigerant fluid resulting in high temperature at the outlet of compressor 6.

The heat must then be discarded from the system to the surroundings in condenser 2. Compressed vapour is cooled by forcing air past condenser 2, analogous to the operation of a car radiator. Thus the vapour coming in to condenser 2 must be hotter than the surrounding air if it is to lose heat. As such, compressor 6 will need to draw more electricity on hot days to provide sufficient condensing temperature to allow heat to be rejected through condenser 2. The higher temperature requirement on hot days manifests as higher pressure at the compressor outlet, hence the increased compression effort required at compressor 6.

At the outlet of condenser 2, the vapour has condensed to liquid at high pressure. The expansion valve drops the liquid pressure before the liquid returns to the evaporator for further cooling.

The performance of a heat pump is defined by a figure of merit called the co-efficient of performance (COP). The COP is usually defined by the ratio of the amount of heat pumped from the evaporator (the cooling effect) to the amount of energy put into the system. For an electric chiller, the COP is defined by the cooling effect in kW divided by the electrical power consumption of the compressor, also in kW. A high COP is associated with a good heat pump.

The COP can be greater than one and this is a common source of confusion. One might clarify this by understanding that the cold is not created; the energy is used only to move heat. A typical 40 kW electric heat pump might have a COP of 4.5.

Since there is a direct relationship between electricity consumption and greenhouse gas emissions, there is an implicit relationship between COP and greenhouse gas emissions.

Care is required in the use of the COP. The rated value is only valid for the rated conditions and any departure in the operating conditions will have significant ramifications for COP. For example, load operation under partial load or changes to the evaporating or condensing temperatures.

The COP can be misleading for other reasons, particularly when comparing electrically driven systems to heat driven systems. In the latter case, customers usually place a higher value on the electrical energy they purchase rather than the waste heat that drives the cooling cycle. Thus a redefined COP expression is warranted. Three definitions are often used:

Thermodynamic COP ($COP_{th}$)—The thermodynamic COP defined as the ratio of cooling effect to total energy required to produce that cooling effect (as above). For a standard heat pump, this might be 4.5

Electrical COP ($COP_{el}$)—The electrical COP is the ratio of cooling effect to electrical energy required. For conventional heat pumps, this is the same as $COP_{th}$.

Primary energy ($COP_{pe}$)—The primary energy COP is the ratio of cooling effect to primary energy consumed including the supply chain (e.g. the coal mine and power station). For a conventional heat pump in Australia, this is typically 0.85.

The $COP_{pe}$ is the preferred definition since it relates most closely to the problems facing heat pump air conditioners, namely greenhouse gas emissions and electricity grid loading.

The COP, electricity consumption and greenhouse gas emissions of a heat pump is largely dictated by the temperature lift between its evaporator and condenser. Thus, a reduction in condensing temperature is most beneficial to reducing greenhouse gas emissions.

For a chiller employed in a containerised datacentre (or data hall), a reduction in condensing temperature of one degree Celsius is equivalent to a reduction of 0.41 kW of compressor electricity consumption.

The idea of operating the electric chiller at night when the ambient temperature is lower than the daytime, and then storing the cooing capacity for later use, would be an obvious approach. However, feasibility studies suggest that the logistics and expense of the extra facilities would not be workable.

In order to reduce energy consumption it is necessary to unload the condenser when it is most under stress. However, in order to do so in a containerised datacentre it must importantly be achieved using both minimal extra equipment and minimal additional space.

The ejector or jet pump principle has been used for some time to produce vacuum for industrial processes using low grade heat. Steam ejectors were used up until the 1930s for cooling purposes, but went out of favour when higher performance vapour compression units became available. Steam driven ejectors up to several hundred kilowatts cooling capacity were not uncommon wherever waste steam or heat was available. Since there is, only one moving part (a pump) in an ejector heat pump, they would typically run for twenty years with no maintenance. Most of the effort in ejector research today is targeted towards coupling ejectors to solar collectors.

Whilst the $COP_{th}$ of standard heat pump (electric chiller) might be about 4.5, ejector heat pumps typically have a $COP_{th}$ of 0.6.

Whilst the $COP_{el}$ of a standard heat pump (electric chiller) might the same as the $COP_{th}$, but ejector heat cycles $COP_{el}$ typically range from 15-50.

Whilst the $COP_{pe}$ of a standard heat pump (electric chiller) in Australia is typically about 0.85, an ejector heat pump $COP_{pe}$ is about 12-45. As such, based on $COP_{pe}$ use of an ejector heat pump cycle is desirable.

One object of the present invention is to provide a data hall module, and method of constructing a data hall infrastructure system that overcomes at least one of the problems associated with the prior art.

Another object of the present invention is to provide a method, apparatus and system that overcomes at least one of the problems associated with the cooling of containerised datacentres (data hall modules). The present invention achieves this by utilising thermal powered compressor (or ejector) technology.

SUMMARY OF THE INVENTION

In a first aspect the present invention consists in a data hall module in the form of a container comprising a top, a bottom, a first pair of opposed sides and second pair of opposed sides, and at least one side of said first pair of opposed sides is open and has a removable panel, wherein for the purpose of transportation, said panel is removably fixed to said open side, and wherein upon delivery to a site said panel may be removed from said open side; so that said data hall module may be bayed adjacent to an open side of at least one like data hall module thereby forming a data hall.

Preferably said module may be removably connected to said like data hall module using connector means, and a sealing means is disposed between said data module and said like data module to effect a seal therebetween.

Preferably said connector means comprises a plurality of elongate plate members.

Preferably said plurality of elongate plate members comprises a top connection plate, a bottom connection plate and two end connection plates.

Preferably said data hall module comprises a plurality of corners, each corner having an associated corner casting with apertures therein, and said top and bottom connection plates each having a plurality of stubs protruding therefrom and adapted to align and engage with apertures in said corner castings.

Preferably said sealing means comprises a gasket.

Preferably in one embodiment said container is rectangular and has a longitudinal axis, and said first pair of opposed sides are sides oriented substantially parallel to said longitudinal axis, so that the baying of said data hall module with the open side of a like data hall module is done in side-by-side relationship and the opposed sides do not intersect said longitudinal axis.

Preferably in another embodiment said container is rectangular and has a longitudinal axis, and said first pair of opposed sides are sides oriented in planes substantially at right angles to said longitudinal axis, so that the baying of said data hall module with the open side of a like data hall module in end-to-end relationship is done at an interface plane that intersects said longitudinal axis.

Preferably utility services enter said data hall through an access port on at least one side of said second pair of opposed sides.

Preferably said data hall module has a shape, size and corner castings of an ISO standard shipping container.

Preferably said data hall module comprising a heat capture device coupled to a refrigerant fluid circulating in a closed circuit through to a chilling device.

Preferably in one embodiment said chilling device is internal of said data hall module. Preferably in another embodiment said chilling device is external of said data hall module.

Preferably said chilling device comprises an evaporator, at least a primary compressor, a condenser and an expansion valve; a heat recuperation means for recuperating at least a portion of the heat captured from IT equipment housed within said module; and a second thermal powered compressor operably powered by said at least a portion of the recuperated heat for supplementing the compressing of the refrigerant fluid carried out by said primary compressor.

In a second aspect the present invention consists in a method of constructing a data hall utilising a plurality of data hall modules, each data hall in the form of a container comprising a top, a bottom, a first pair of opposed sides and second pair of opposed sides, and at least one side of said first pair of opposed sides is open and has a removable panel, wherein for the purpose of transportation, said panel is removably fixed to said open side, and wherein during construction said plurality of data hall modules are bayed in side-by-side relationship so that their open sides are adjacent to each other and/or in end-to-end relationship so that their open ends are adjacent to each other.

Preferably said bayed data hall modules are connected to each other by removable connector means.

Preferably during connection of said bayed data hall modules, said connection includes the placement of sealing means to affect a fluid-proof seal at the interface between interconnected bayed data hall modules.

Preferably in one embodiment at least one data hall module comprises a heat capture device coupled to a refrigerant fluid circulating in a closed circuit through to a chilling device.

Preferably in one embodiment said chilling device is internal of said data hall module.

Preferably in another embodiment said chilling device is external of said data hall module.

Preferably said chilling device comprises an evaporator, at least a primary compressor, a condenser and an expansion valve; a heat recuperation means for recuperating at least a portion of the heat captured from IT equipment housed within said module; and a second thermal powered compressor operably powered by said at least a portion of the recuperated heat for supplementing the compressing of the refrigerant fluid carried out by said primary compressor. Preferably in another embodiment at least one data hall module is provided with heat capture means that in use captures low grade heat emanating from IT equipment housed in said data hall, and using same to at least partially power chilling equipment via a thermal powered compressor.

In a third aspect the present invention consists in a data hall assembly system, said system comprising:
a plurality of data hall modules, each data hall module comprising a top, a bottom, a first pair of opposed sides and second pair of opposed sides, and at least one side of said first pair of opposed sides is open and has a removable panel;
a plurality of connection means for interconnecting said plurality of data hall modules when said data hall modules are bayed in side-by-side and/or end-to-end relationship; and a plurality of sealing means, each sealing means used to effect a fluid-proof seal at the interface between bayed data hall modules interconnected by a respective one of said connection means.

Preferably at least one data hall module is provided with heat capture means that in use captures low grade heat emanating from IT equipment housed in said data hall, and using same to at least partially power chilling equipment via a thermal powered compressor.

In a fourth aspect the present invention consists in a device for chilling a containerised datacentre unit for housing IT equipment, said chilling device comprising:
a first refrigerant fluid circulating through a first closed circuit through an evaporator, at least a first compressor, a condenser and an expansion valve; and
a heat capture means for capturing at least a portion of the heat emanating from said IT equipment in use; and wherein said at least first compressor is a thermal powered compressor being powered by said heat.

Preferably said device has a second electric powered compressor.

Preferably said second electric powered compressor is the primary compressing unit of a second refrigerant fluid circulating through a second closed circuit and said thermal powered compressor of said first closed circuit is a supplementary compressing unit that reduces the heat load imposed on the second closed circuit.

In a fifth aspect the present invention consists in a device for chilling a containerised datacentre unit for housing IT equipment said device comprising two integrated closed cooling circuits, being a first closed cooling circuit comprising a first refrigerant fluid circulating through an evaporator, at least a first electric compressor, a de-superheater, a first condenser, a pre-cooler and an expansion valve; and
a second closed cooling circuit comprising a second refrigerant fluid through a thermal powered compressor, wherein said thermal powered compressor is powered by heat from said de-superheater and provides cooling to said pre-cooler, and wherein heat withdrawn from said second cooling circuit is expelled through a second condenser.

In a sixth aspect the present invention consists in a method of chilling a containerised datacentre unit for housing IT equipment, said method comprising:
(i) circulating a first refrigerant fluid through a first closed circuit including an evaporator, at least a first compressor, a condenser and an expansion valve;

(ii) capturing of waste heat emanating from said IT equipment, and utilising said waste heat to power a second thermal powered compressor in a second closed circuit through which a second refrigerant fluid circulates; and
(iii) utilising the second closed circuit to reduce the heat load imposed on the first circuit.

In a seventh aspect the present invention consists in a method of recycling energy used to power IT equipment housed in a datacentre, said method comprising the steps of
(i) capturing at least a portion of the waste heat emanating from said IT equipment and passing through a first closed chilling circuit;
(ii) delivering said at least a portion of the waste heat to a thermal powered compressor in a second closed chilling circuit for operably powering same; and
(iii) and using said second closed chilling circuit to reduce the heat load in said first closed chilling circuit.

In an eighth aspect the present invention consists in a containerised datacentre modular unit for housing IT equipment, said unit comprising:
a chilling device including a first refrigerant fluid circulating in a first closed circuit through an evaporator, a primary compressor, a condenser and an expansion valve;
a heat capture means for capturing at least a portion of the heat emanating from said IT equipment in use; and
a second refrigerant fluid circulating in a second closed circuit through a secondary thermal powered compressor operably powered by said at least a portion of the heat for supplementing the cooling of the first refrigerant fluid carried out by said primary compressor.

In a ninth aspect the present invention consists in a system for cooling a containerised datacentre for housing IT equipment, said system comprising:
(i) a first chilling means including a first refrigerant fluid circulating in a first closed circuit through an evaporator, a first primary compressor, a condenser and an expansion valve;
(ii) a second chilling means including a second refrigerant fluid circulating in a second closed circuit through a second thermal powered compressor means operably powered by waste heat for supplementing the cooling of the first refrigerant fluid carried out by said primary compressor; and
(iii) a control unit for managing and controlling any of said chilling means, said heat capture means and said second thermal powered compressor means.

MODE OF CARRYING OUT INVENTION

The FIGS. 1 to 18 depict a data hall module 100 and its use with other like data hall modules to create a larger data hall 150, and components that can be use for "Site Infrastructure" thereof. The data hall modules 100 are used in combination with other components not only to provide the data hall, but to provide a "datacentre infrastructure system" that provide an environment for operating ICT equipment. The data hall modules 100 are used as prefabricated data hall enclosures and site infrastructure components necessary to provide expandable space, power and cooling to facilitate the efficient deployment and operation of datacentre capacity.

Data hall modules 100 are designed with high grade insulation to establish a controlled temperature environment that is not effected by outside ambient conditions. This is critically important for establishing an effective heat recuperation system that can function in a wide range of climates.

Data hall modules 100 may employ heat recuperation systems such as direct coupled systems that may connect directly to ICT equipment that may for example be fitted with technology as heat plate and/or heat pipe technology. Data hall modules 100 may employ heat recuperation such as air coupled to ICT equipment, with such technology as Hot Aisle Containment systems and Cold Aisle Containment systems as examples, which can be readily deployed inside data hall modules 100.

Ideally, the size of any constructed data hall using the data hall modules 100 should preferably be just large enough to enclose the ICT equipment and to allow for safe maintenance access but not too large that cooling and humidification resources are wasted on conditioning surplus space. A single contiguous space facilitates efficient operation and maintenance practices in a datacentre facility, however, datacentre floor space requirements tend to expand and contract dramatically over time as ICT operations cycle through periods of ICT equipment consolidation to remove legacy ICT systems and periods of ICT equipment expansion as investment in the latest ICT begins anew. A system for rapidly expanding (and contracting) datacentre floor space is a feature of using data hall modules 100 to construct a "data hall" or "Data Centre Infrastructure System", which supports right-sizing of data hall floor space for improved efficiency.

Figure 1:
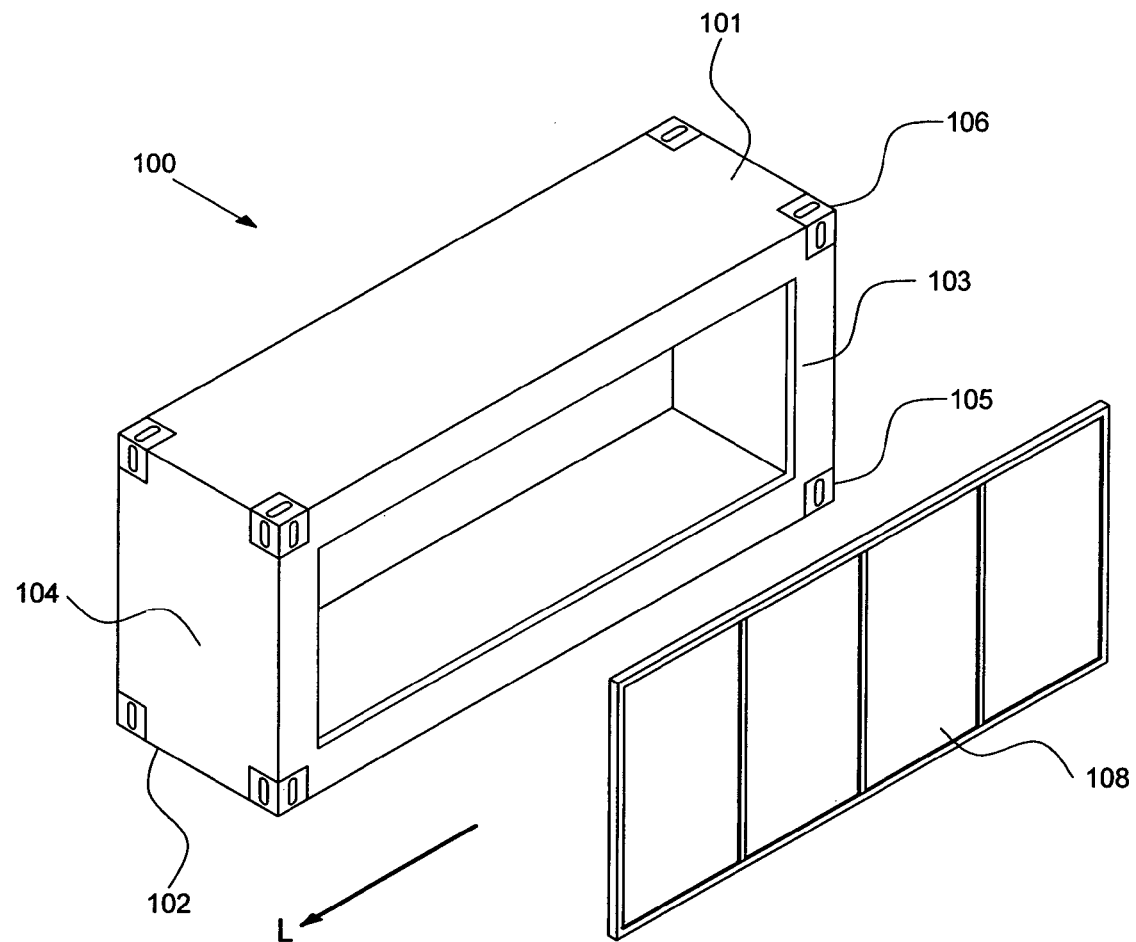
FIG. 1 is a perspective view of a data hall module in accordance with a first preferred embodiment of the invention, where the longitudinal side is an open side.
Figure 2:
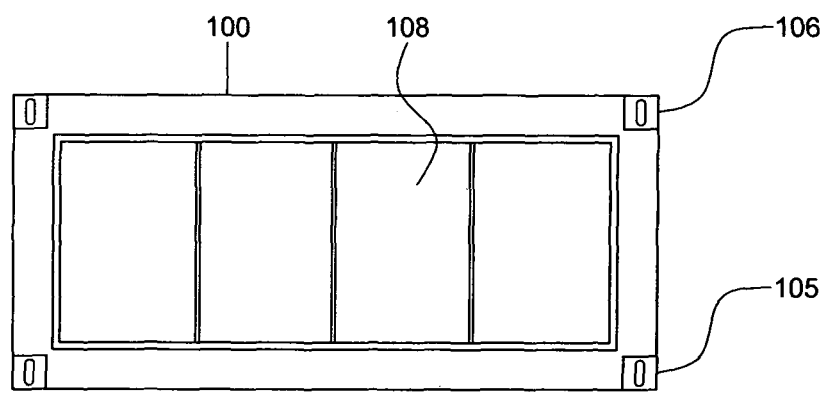
FIG. 2 is an elevational schematic view of the data hall module of FIG. 1, with side panel attached to the open side.
Figure 3:
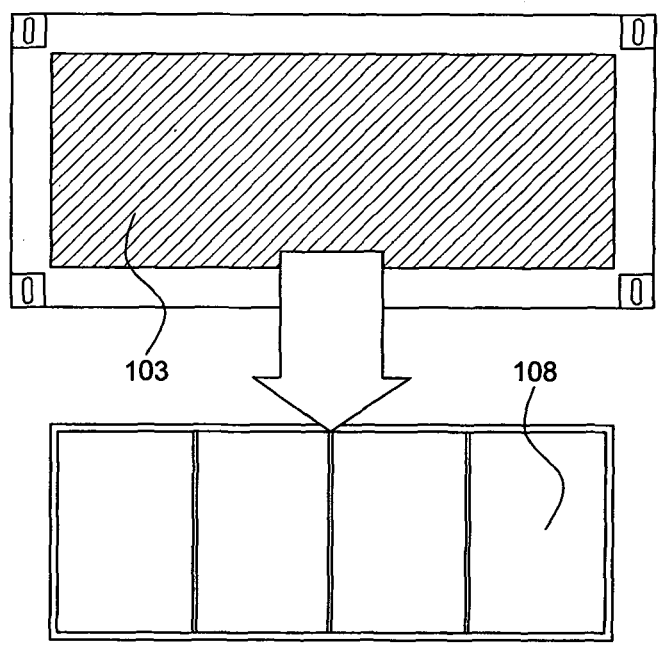
FIG. 3 is an elevational schematic view of the data hall module of FIG. 1, with side panel removed from the open side.
Figure 4:
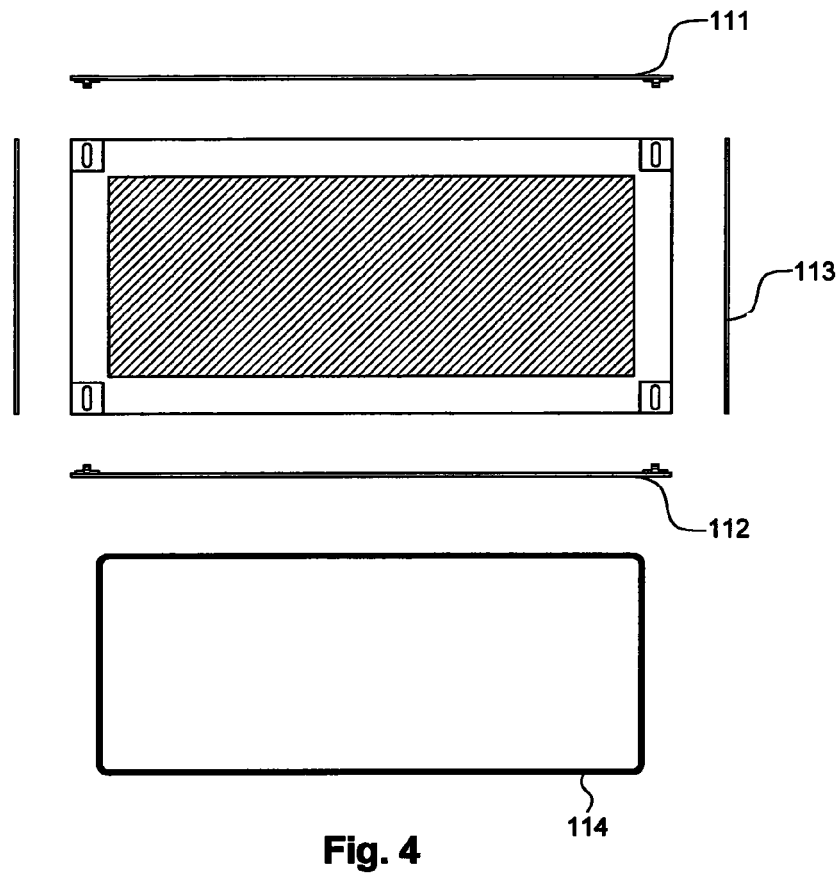
FIG. 4 is an elevational exploded schematic view of the connection means used to bay a data hall module to another.
Figure 5:
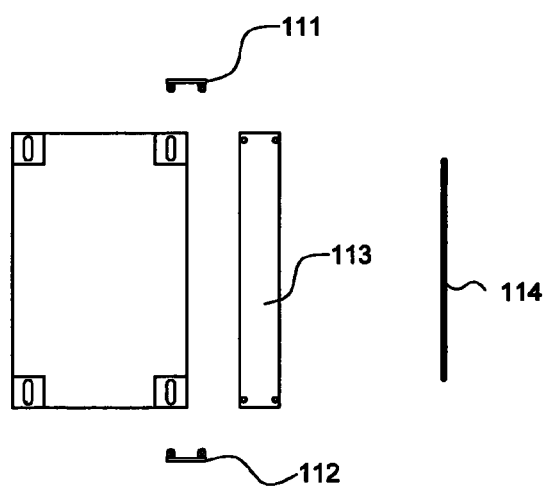
FIG. 5 is an end exploded schematic view of the connection means shown in FIG. 4 used to bay a data hall module to another.
Figure 6A:
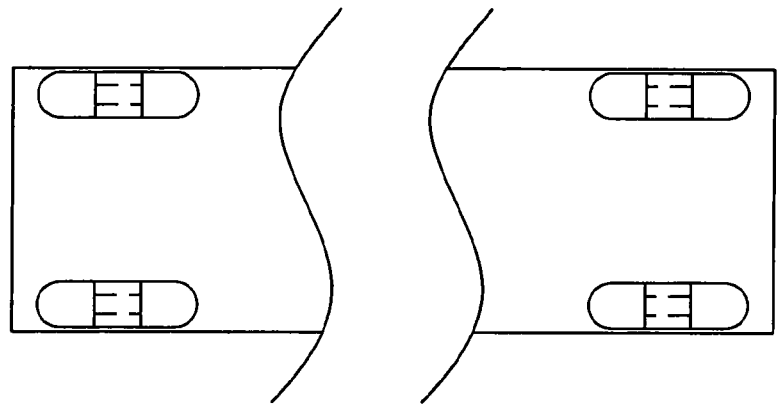
FIGS. 6(a)-6(c) are enlarged detailed plan, elevation and end views of the stubs of the top (or bottom) connection plates.
Figure 6B:
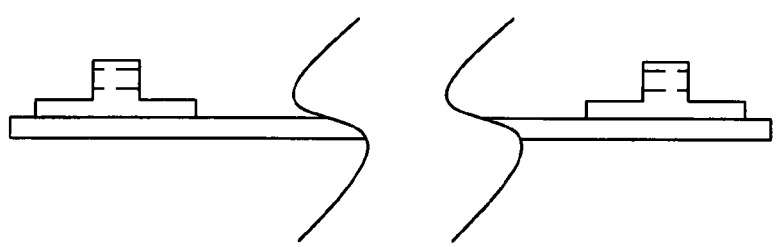
Figure 6C:
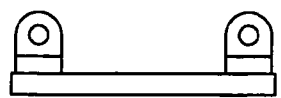
Figure 7:
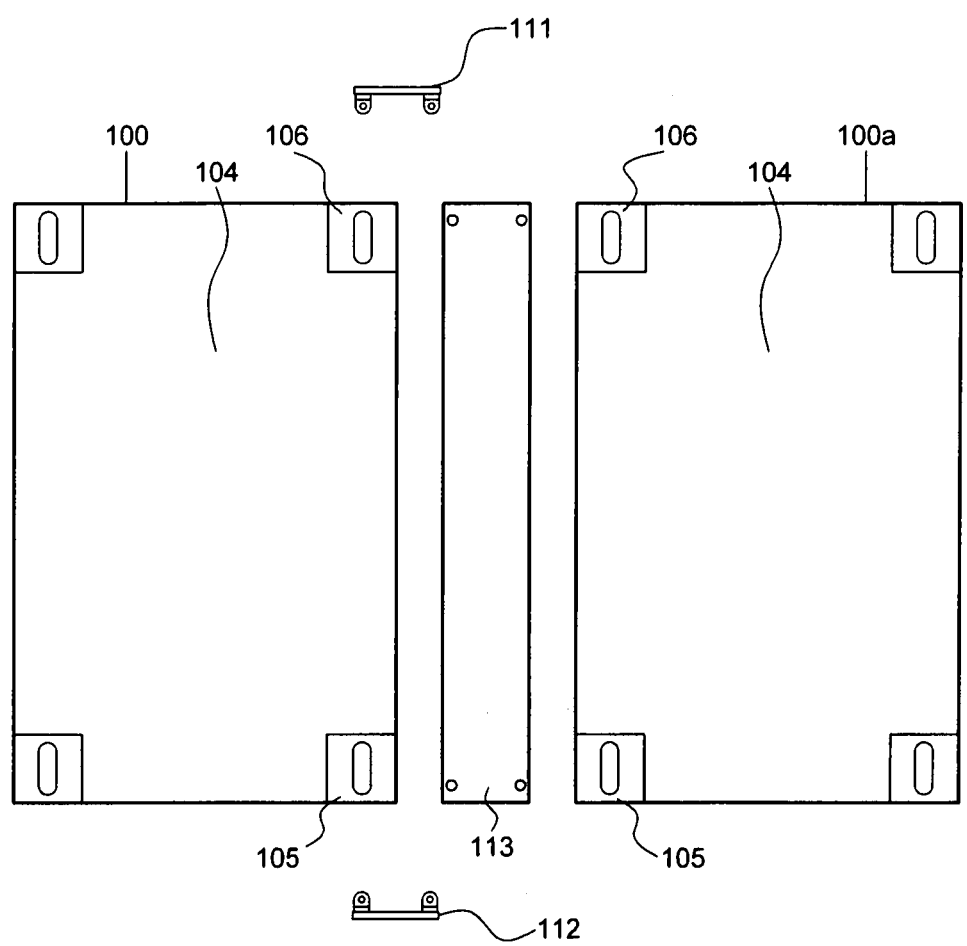
FIG. 7 is an exploded end view of two data hall modules of the type shown in FIG. 1 and connection means shown to connect them.

FIGS. 1 to 3 depict an embodiment of data hall module 100 in the form of a container, which preferably has a shape, size and corner castings of an ISO standard shipping container. Data hall module 100 comprises a top 101, bottom 102, two opposed longitudinal sides 103 and two opposed ends 104. Data hall module 100 extends longitudinally with respect to a "longitudinal axis" such that its ends 104 are substantially at right angles to both its side walls 103 and longitudinal axis L.

Figure 8:
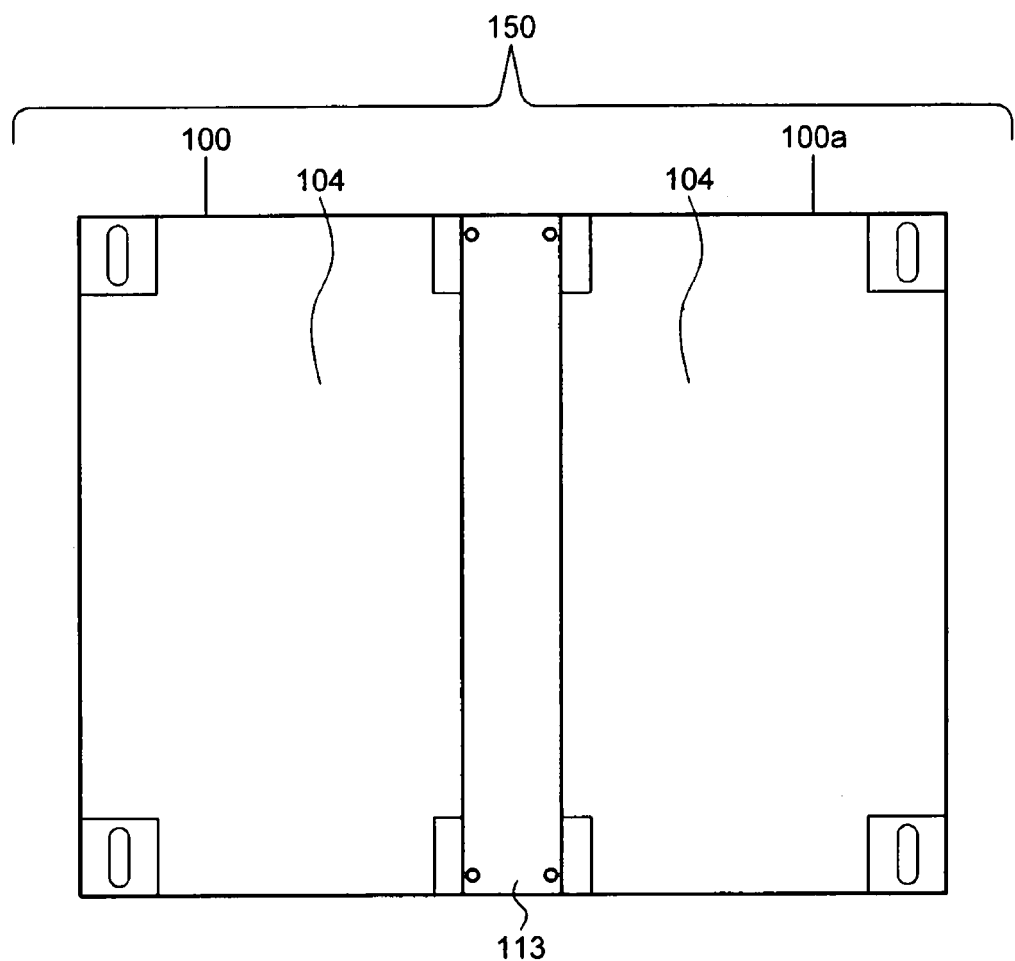
FIG. 8 is an assembled end view of two data hall modules and connection means shown in FIG. 7.

Data hall module 100 comprises removable side wall panels 108 that may be fixed to the container for the purpose of secure transportation, and then removed upon delivery to site to enable the data hall module 100 to be "bayed" to the side of another like data hall module 100*a* to form a data hall 150 (see FIG. 8). Subsequent data hall modules 100 may be bayed to incrementally expand the size of the data hall. Conversely, data hall modules 100 may be "unbayed" and refitted with side wall panels 108 to reduce the overall size of data hall 150. The removable side wall panels 108 may take the form of simple fixed panels or hinges door panels.

The connection means (parts) required to bay the data hall modules 100 and 100*a* together are shown in FIGS. 4-8. The connection means (parts) comprise top connection plate 101, bottom connection plate 102, end connection plate 103 and a sealing means in the form of rubber gasket 114.

Figure 9:
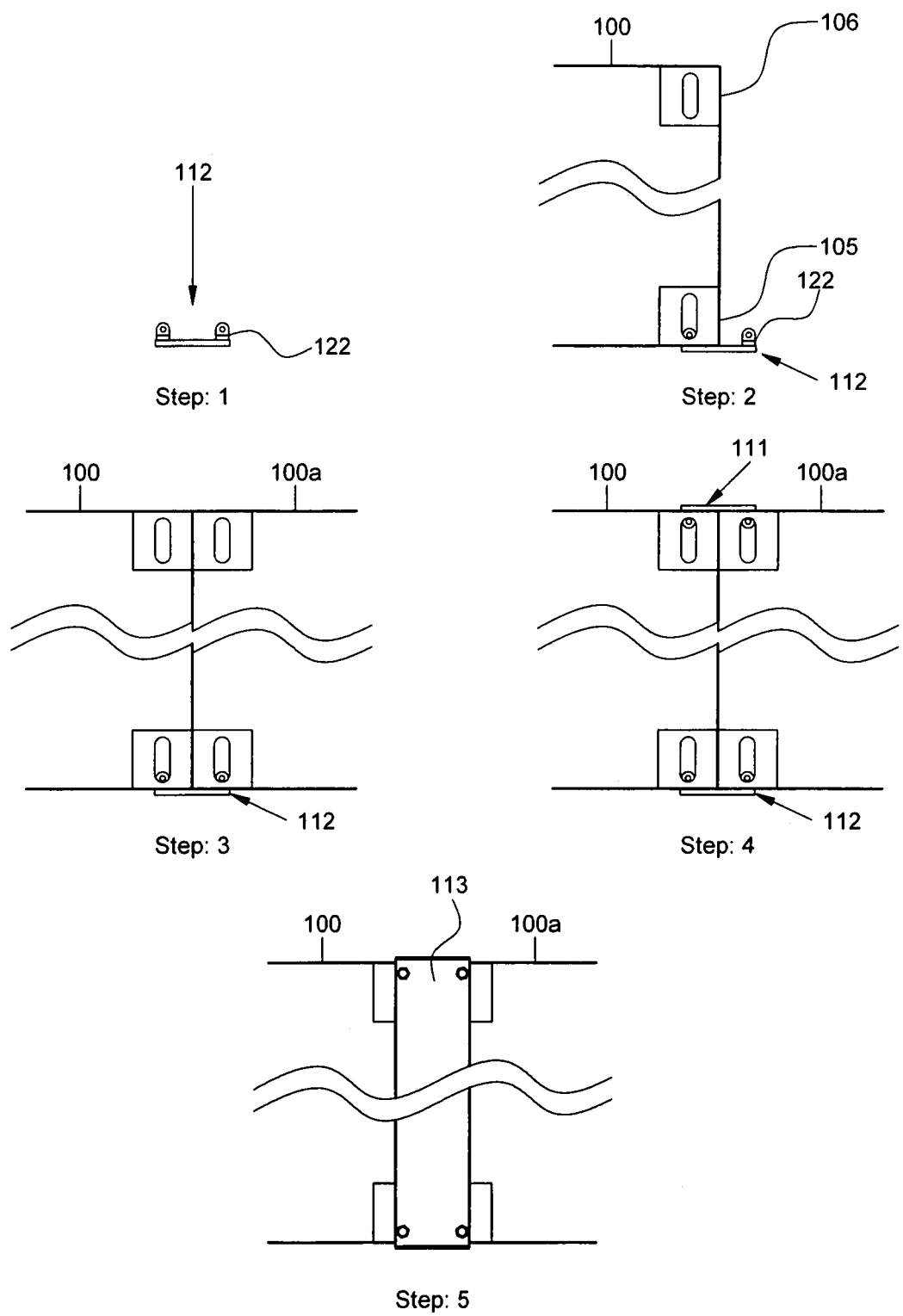
FIG. 9 depicts the five steps of "connection procedure" of two data hall modules of the type shown in FIG. 1.

The various steps (or procedure) of connecting (joining) the containers is illustrated in FIG. 9 and begins with positioning a bottom connection plate 112 on a flat surface, as shown in step 1 of FIG. 9. Bottom connection plate 112 spans the length of the side of data hall modules 100,100*a* that are being bayed together. The bottom connection plate 112 comprises a pair of guide stubs 122 that protrude upwards at each end of the plate 112 and are designed to fit precisely into the bottom corner castings 105 of the two data hall modules 100,100*a* see FIGS. 6(*a*)-6(*c*). In this way the bottom edge of the data hall modules 100, 100*a* are able to be precisely positioned together. "Step 2" shows the placement of a data hall module 100 on bottom connection plate 112 by aligning corner castings 105, whilst "Step 3" shows the placement of module 100*a* in a like manner.

Similarly, as see in "Step 4" a top connection plate 111 comprising stubs 121 protruding downwards at each end of the plate 111 are designed to fit precisely into the top corner castings 106 of the two data hall modules 100, 100*a*. In this way the top edge of the data hall modules are able to be precisely positioned together. With the bottom and top connection plate in position, the two like data hall modules 100, 100*a* are now aligned and separated by a precise gap determined by the guide stubs 121, 122 located on the connection plates. 111, 112. The bottom connection plate 112 and top connection plate 111 also provide a protective cover over the bottom side and the top side of the join.

Gasket 114, which traverses the entire perimeter of the join, may be punched into the precise gap that has been created between the two data hall modules 100, 100*a*. The rubber gasket 104 forms a fluid tight (air tight and water tight) seal around the perimeter of the join. This occurs between Steps 4 and 5.

The stubs 121, 122 on each connection plate 111,112 are pre-tapped, so that they may receive a bolt from the end wall side of each respective corner casting 105,106. An end connection plate 113 may span the height of the joined data hall modules 100,100*a*. End connection plate 113 comprises a pair of bolt holes that align with the exposed end side of each corner casting 105,106 and also align precisely with the tappings in the stubs 121,122 that now sit inside the corner castings. As shown in "Step 5" end plates 113 are then bolted to the stubs 121,122 to cover the end wall sides of the join between data hall modules 100,100*a*. The pair of end connection plates 113 provides a secure cover over the end wall sides of the join. A detailed view of the stubs is presented in FIGS. 6(*a*)-6(*c*).

In this first embodiment, utility services such as electrical services, mechanical services, and communications services and personnel access doors may be fitted to the end wall side so as to not interfere with the detachable side wall panels and baying process. Connection to external electrical, mechanical and communications services may occur through the first deployed data hall module 100. Subsequent data hall deployments may take electrical services, mechanical services and communication services from the first deployed data hall module 100. In this way subsequent data hall modules do not require additional external service connections.

Figure 10:
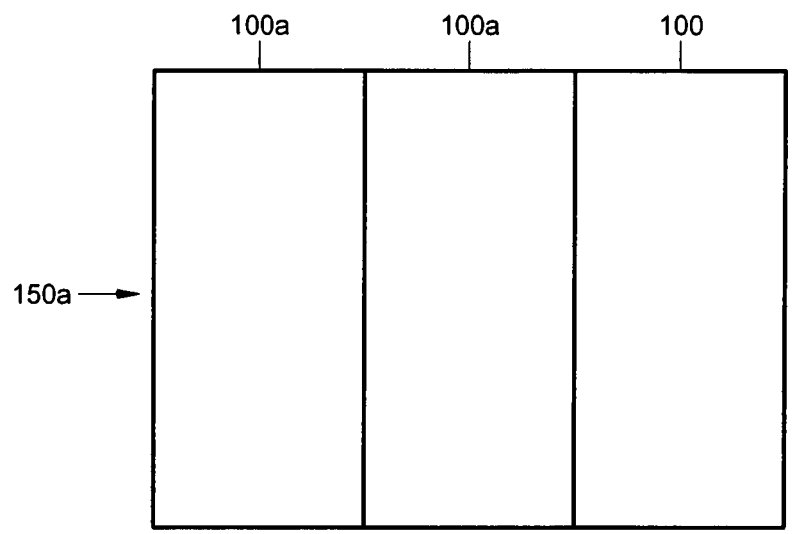
FIG. 10 is a plan view of three data hall modules of the type shown in FIG. 1 bayed and connected in side-by-side relationship to form a data hall.

Such an array of three data hall modules 100,100*a* bayed and connected in side-by-side relationship to form a data hall 150*a* is shown in FIG. 10.

Figure 11:
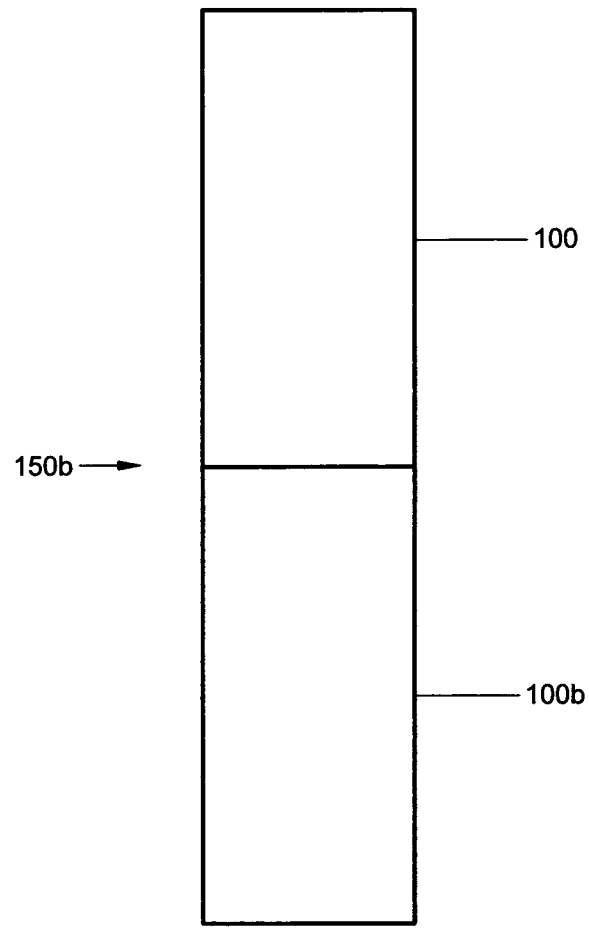
FIG. 11 is a plan view of two data hall modules of the type shown in FIG. 18 bayed and connected in end-to-end relationship to form a data hall.
Figure 13:
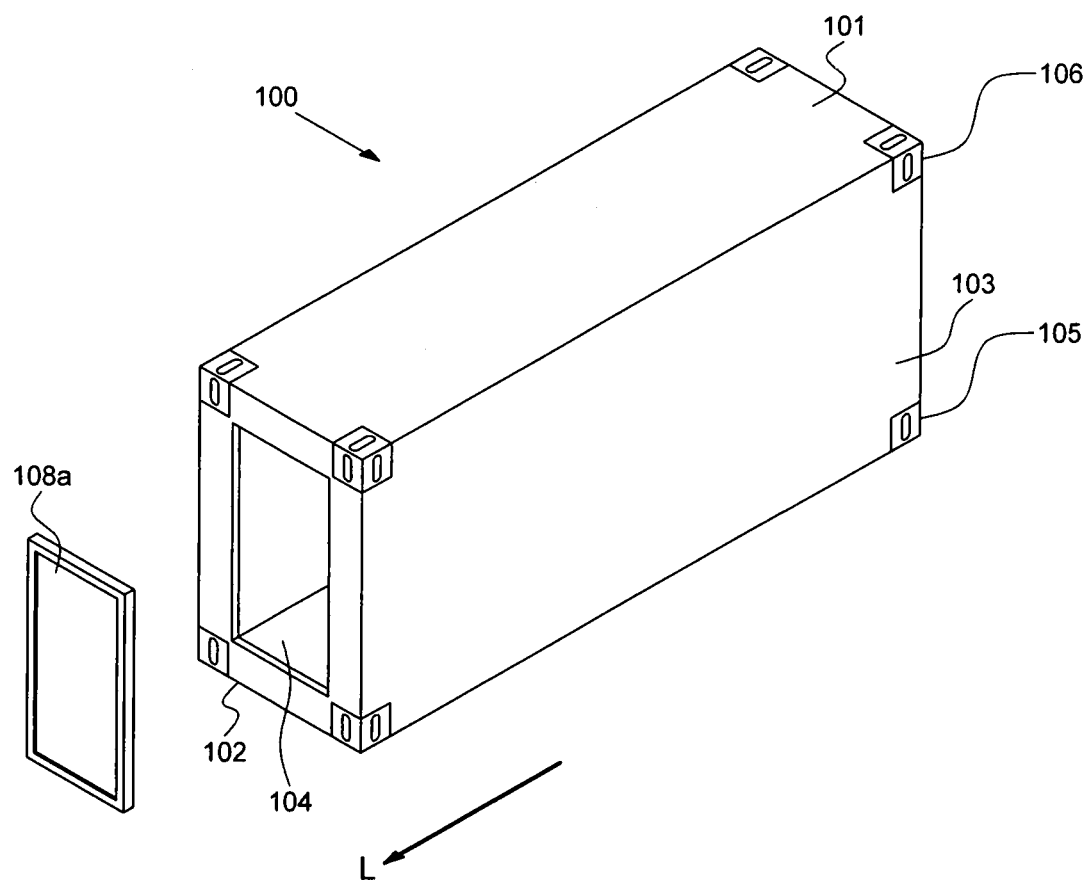
FIG. 13 is a perspective view of a data hall module in accordance with a second preferred embodiment where the end side is the open side.

A second embodiment of an expandable data hall module, as shown in FIG. 13 may comprise an end wall 104 that is open with removable side wall panel 108*a* fitted to that end to allow expansion from the end side of data hall module 100. In this second embodiment, utility services such as electrical services, mechanical services, and communications services and personnel access doors may fitted to the side wall 103, so as to not interfere with the detachable end wall panels attached to ends 104 and baying and connection procedure. An example of such an array of two data hall modules 100, 100 bayed and connected in end-by-end relationship to form a data hall 150*b*, is shown in FIG. 11.

Figure 12:
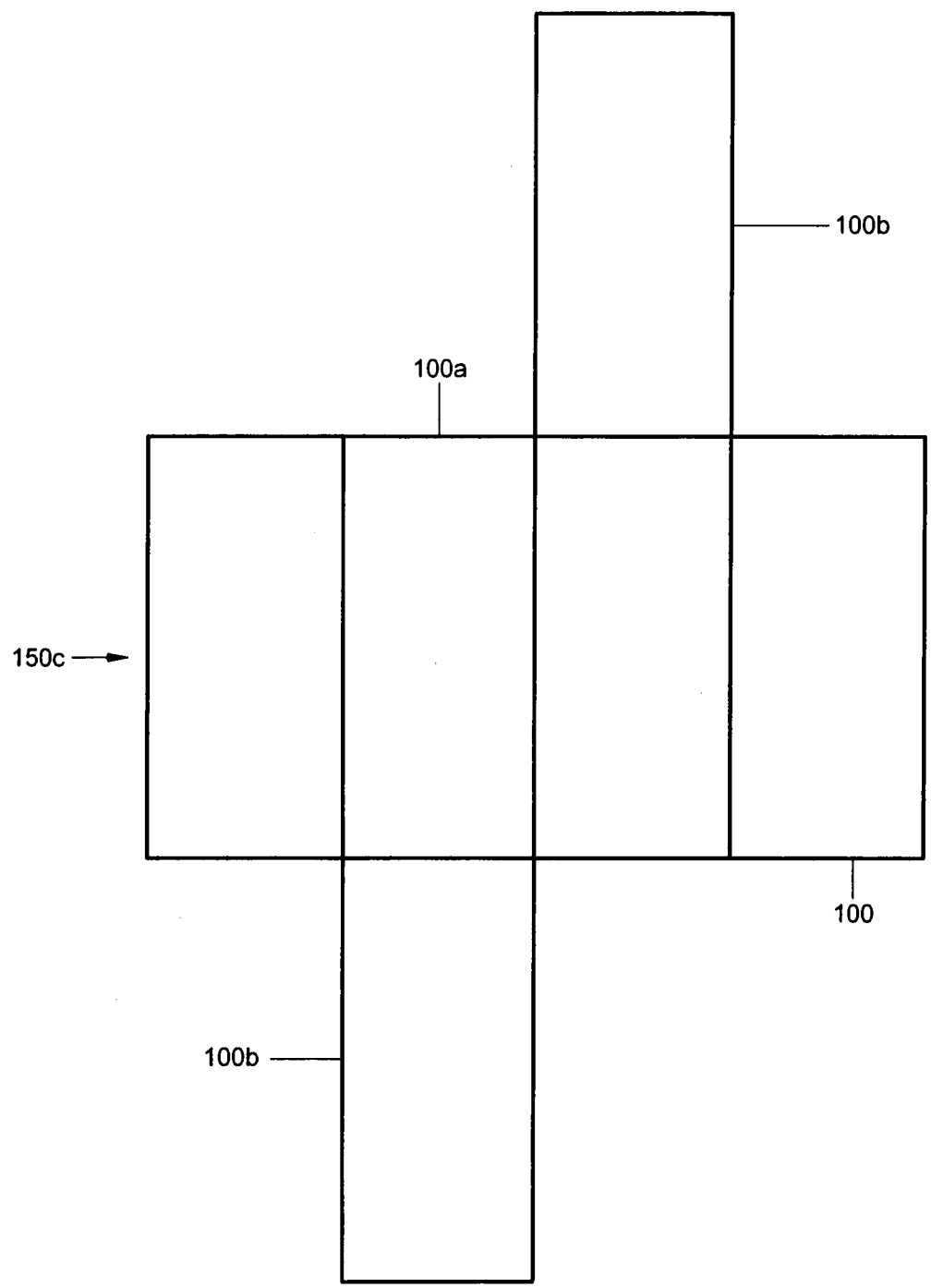
FIG. 12 is a plan view of six data hall modules of the types shown in FIGS. 1 and 18 bayed and connected in a combination of both side-by-side and end-to-end relationship.

It is also possible to combine the baying and connecting of data hall modules 100, 100*a* and 100*b*, in both side-by-side relationship and end-to-end-relationship so that an expanding data hall is constructed. An example of data hall 150*c* comprising six data hall modules is shown in FIG. 12.

A comprehensive "Site Infrastructure" approach to constructing data halls (data centres) 150 by assembling a plurality of data hall modules 100, gives rise to better overall energy utilisation and management practices. Waste energy in one part of the "Site Infrastructure" may be harnessed to do useful work in another part of the Site Infrastructure. Better overall energy management from an end-to-end energy monitoring and control system is when a comprehensive Site Infrastructure approach is adopted. One approach to this is discussed below, where "heat capture means" are employed in one or more data hall modules 100 to recuperate heat from IT equipment housed therein and used to supplement power to the chilling system used to cool the data hall.

Figure 14:
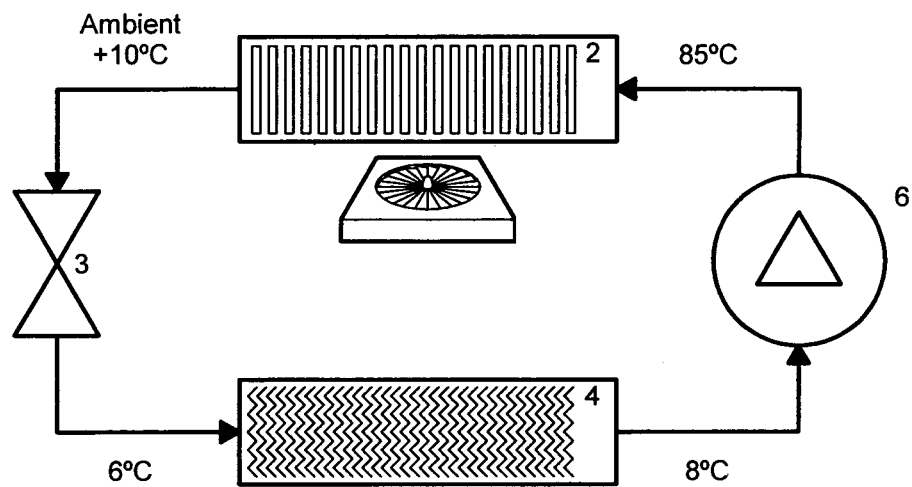
FIG. 14 is a schematic circuit of prior art conventional electric chiller.

FIG. 14 depicts a basic ejector chiller system (prior art in its simplest form) employed in the cooling of ICT equipment housed in the data hall modules 100. The ejector chiller system is used to recycle the steady source of low grade heat 8 emanating from the ICT equipment contained within the cabinet(s) of the data hall modules 100.

The ejector chiller system of FIG. 14 may be similar to the prior art conventional electric-powered chiller, in that it may employ a refrigerant fluid passing through a condenser 2, expansion valve 3 and an evaporator 4. The ejector chiller system of FIG. 14, which can be referred to as an "ejector heat pump" employs a cooling effect achieved by evaporation of a refrigerant to a vapour at low pressure in evaporator 4. The cold vapour then absorbs heat but must be recompressed for the cycle to continue.

Figure 15:
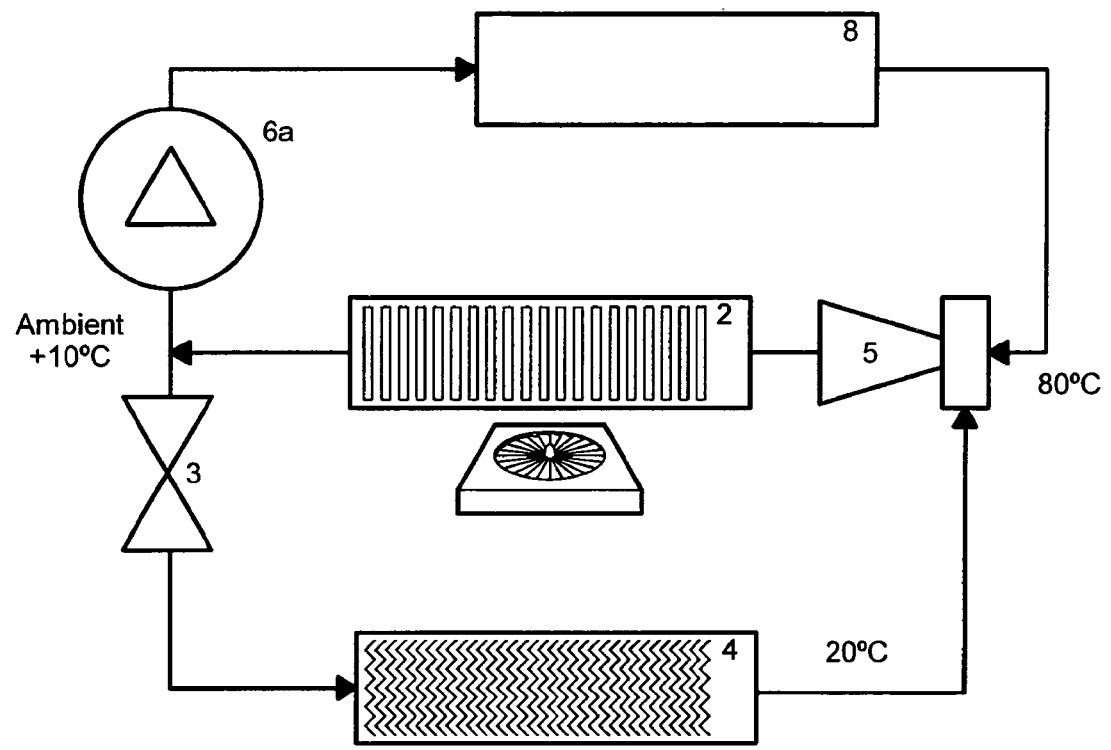
FIG. 15 is a schematic circuit of an ejector chiller in accordance with a first embodiment of the present invention.

However, in ejector chiller system of FIG. 15 the "electrical compressor" of the prior art has been now replaced by a "heat powered" or "thermal powered" compressor, otherwise known as ejector 5. The heat of compression is then passed through condenser. 2

Ejector 5 is suited to operating from steady sources of heat, and in this embodiment is particularly suited to operating using as the low grade waste heat from data centres, depicted as heat source 8. Ejector 5 can be made to operate from low grade heat with temperatures as low as 70° C. provided that the evaporating temperature is not too low.

The energy supply to ejector 5 is partly heat recovered as noted and partly from high pressure provided by an auxiliary pump 6*a*. Only a few hundred watts of electricity are required to operate pump 6*a*. The refrigerant fluid is expanded through a supersonic nozzle inside ejector 5, creating a low pressure region in the vicinity of an evaporator port. This provides the suction effect of the ejector 5. The geometry of the internal passages of ejector 5 is responsible for the subsequent thermodynamic compression effect, comprising a supersonic shock and a subsonic diffusion process.

The performance of ejector 5 is dependent upon the pressures (and thus temperatures) at each of its ports as well as its internal geometry.

The selection of refrigerant for the ejector system is much less restricted than for a conventional heat pump since there are no issues of lubricant compatibility, compressor slugging and less performance sensitivity. Indeed water is the appropriate choice for this embodiment since the evaporation temperature of ejector 5 will preferably be higher than usual for prior art steam ejectors.

Figure 16:
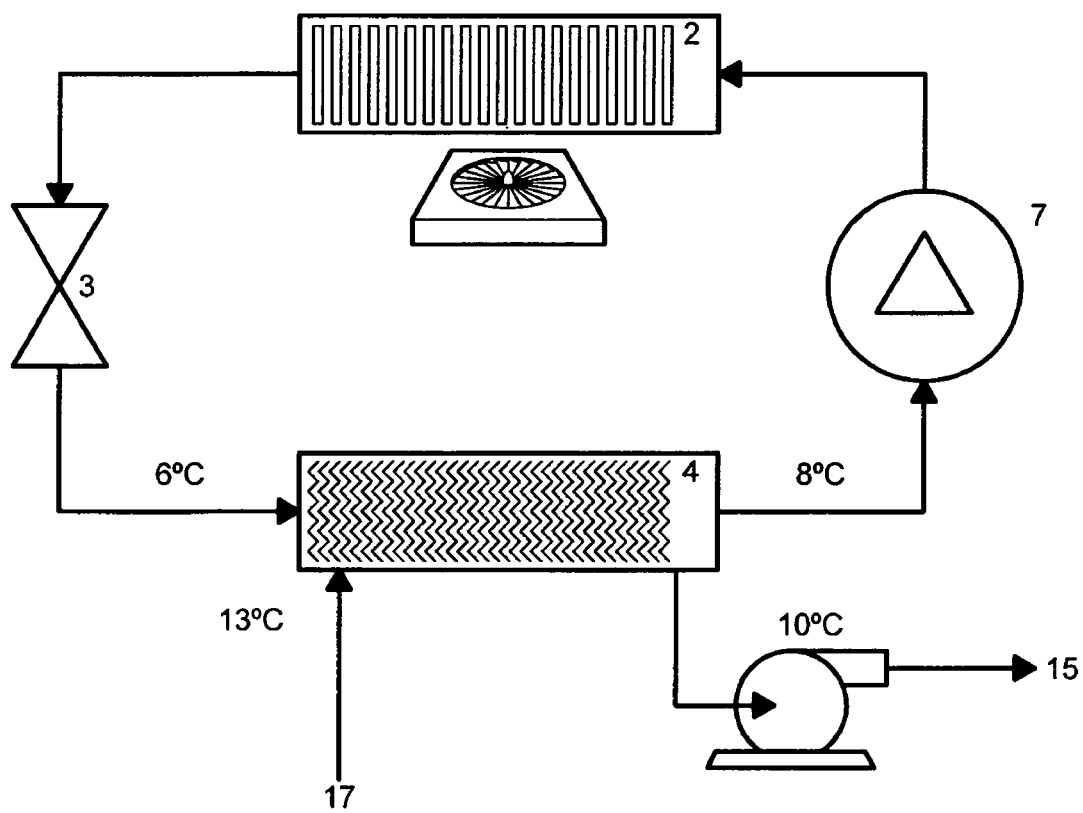
FIG. 16 is a schematic circuit of a second embodiment of the present invention, where a chiller is coupled to the cabinets within the data hall modules of a data hall using a chilled water loop.

The low grade heat emanating from the ICT equipment within the data hall modules 100,100*a*, 100*b* will be captured by a "heat capture system". In a second embodiment this heat capture system may involve circulating water circulating chilled water between the ICT equipment and the chillers, as shown in FIG. 16. A heat recuperator such as a rack mounted fan/coil heat exchange unit may be used to allow chilled water to absorb heat could then be transported back to the electric chillers for removal through the compressor/condenser. Chilled water would typically leave the chiller at 10° C., see location 15 and return at 13° C., see location 17. Although large variation in the set point for the chilled water supply temperature can be achieved, it is likely that the temperature will be set sufficiently low to achieve some dehumidification of the air in the data hall space. However, if dehumidification is not required and direct coupling is used in the heat capture system then additional energy efficiency can be achieved by having the set point as high as 60° C.

Figure 17:
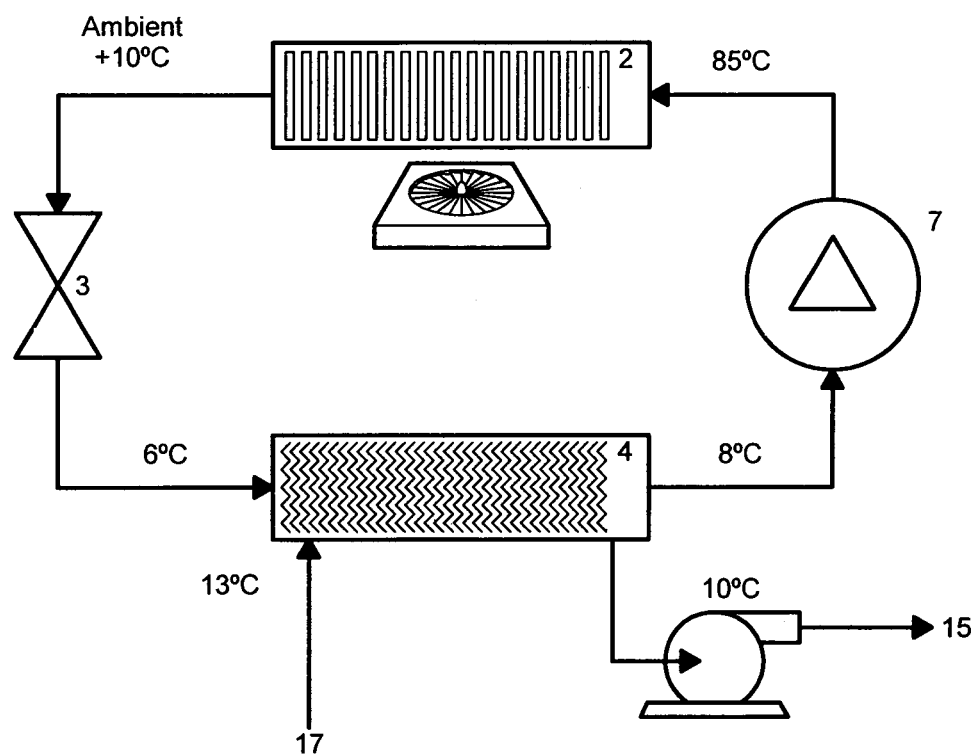
FIG. 17 is a schematic circuit of the second embodiment as shown in FIG. 3, with identification of the heat extraction points.

The heat captured from the data hall 150 can be removed at the electrical compressor 7 to drive the ejector 5, see FIG. 17. This has the distinct advantages of low capital cost, small space requirement and high yield. Whenever the compressor 7 is running, heat would be available to drive ejector 5. There is also an excellent synergy arising from the direct correlation between compression temperature and condensing temperature.

The additional cooling capacity provided by the ejector 5 is introduced before the chiller's expansion valve 3 to sub-cool the high pressure refrigerant liquid. This is a well established refrigeration technique that results in increased cooling capacity of the electric chiller at the evaporator and hence a higher COP.

Figure 18:
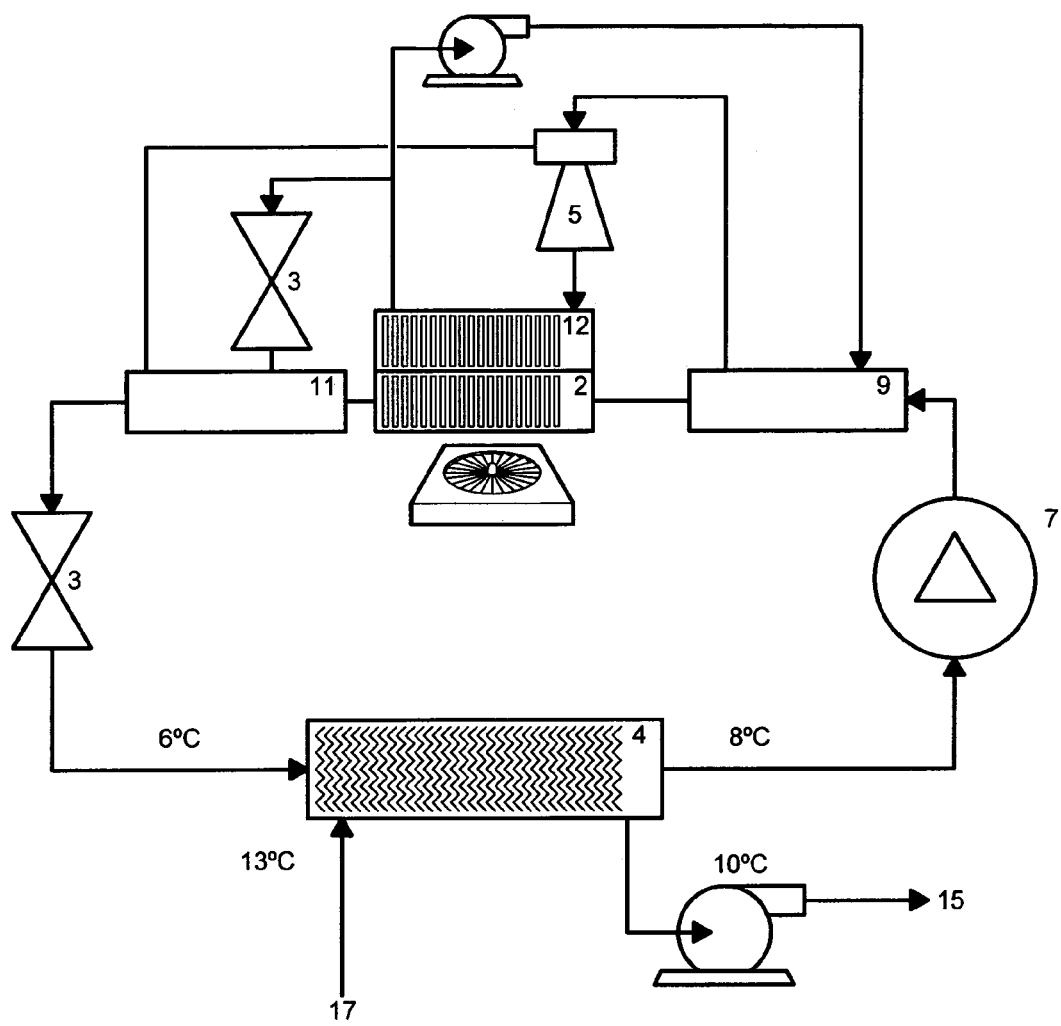
FIG. 18 a schematic circuit of a third embodiment of the present invention, with the integration electric chiller and the addition of two heat exchangers.

In a further third embodiment heat could be extracted from the electric chiller through a heat exchanger known as a de-superheater 9, see FIG. 18. De-superheater 9 removes the highest quality (temperature) heat in the cycle, thus allowing the ejector 5 to operate effectively and simultaneously reducing the heat load on the condenser 2. The condenser 2 thus has a greater cooling capacity which benefits the COP.

Ejector 5 operates to provide cooling in its own evaporator, now renamed the pre-cooler 11 in the integrated system. Pre-cooler 11 provides sub-cooling to the refrigerant liquid leaving the condenser 2. This reduction in temperature of the refrigerant liquid entering the electric chiller's evaporator 4 results in increased cooling capacity there and thus improves the COP of the electric chiller.

The heat withdrawn by the ejector system from both the de-superheater 9 and the pre-cooler 11 could be expelled through a second condenser 12. This is much smaller than the electric chiller condenser.

The integration of the two cooling circuits in this manner would substantially increases the COP of the electric chiller at the time at which it is most required. The electric chiller's resultant increasing effectiveness with rises in ambient temperature correlates well with increasing demand for cooling and thus peak electricity demand. A central monitoring and control system (not shown) is preferably manage and control one or more of the components and optimise the energy performance of the overall system.

Although ejectors are most commonly used to provide direct refrigeration, their performance is substantially increased when the pre-cooler temperature is allowed to moderate from the usual 8° C. to the 20° C. in this application. This allows the ejector 5 to be driven from a lower than normal temperature heat source while maintaining reasonable performance.

One might consider solar energy as an alternative source of heat for the ejector system performance. This option currently brings high capital cost and has low energy yield since the daily solar radiation on the limited area of surface of fixed orientation is not large compared to the chiller electricity consumption. However, there will be some coincidence of solar availability and cooling demand and it may be possible to optionally retrofit a solar energy system that will further boost the performance of an integrated ejector system.

The abovementioned embodiments are described with reference to cooling ICT equipment such as computers and other hardware housed in cabinets the data hall modules. Such a containerised data centre may be a "modular unit" for use with other such units. The chilling equipment as described in the abovementioned embodiments would be contained within the modular unit.

The invention claimed is:

1. A data hall module in the form of a container comprising a top, a bottom, a first pair of opposed sides and second pair of opposed sides, and at least one side of said first pair of opposed sides is open and has a removable panel, wherein for the purpose of transportation, said panel is removably fixed to said open side, and wherein upon delivery to a site said panel is removable from said open side to bay said data hall module adjacent to an open side of at least one like data hall module thereby forming a data hall, and said data hall module is removably connectable to said like data hall module using connector means, and a sealing means is disposed between said open side of said data hall module and said open side of said like data hall module to effect a seal therebetween.

2. The data hall module as claimed in claim 1, wherein said sealing means traverses the perimeter of the join between said data hall module and said like hall module.

3. The data hall module as claimed in claim 2, wherein said sealing means comprises a gasket.

4. The data hall module as claimed in claim 1, wherein said connector means comprises a plurality of elongate plate members.

5. The data hall module as claimed in claim 4, wherein said plurality of elongate plate members comprises at least at least two end connection plates.

6. The data hall module as claimed in claim 4, wherein said plurality of elongate plate members comprises at least a top connection plate and a bottom connection plate.

7. The data hall module as claimed in claim 6, wherein said data hall module comprises a plurality of corners, each corner having an associated corner casting with apertures therein, and said top and bottom connection plates each having a plurality of stubs protruding therefrom and adapted to align and engage with apertures in said corner castings.

8. The data hall module as claimed in claim 1, wherein said container is rectangular and has a longitudinal axis, and said first pair of opposed sides are sides oriented substantially parallel to said longitudinal axis, so that the baying of said data hall module with the open side of a like data hall module is done in side-by-side relationship and the opposed sides do not intersect said longitudinal axis.

9. The data hall module as claimed in claim 1, wherein said container is rectangular and has a longitudinal axis, and said first pair of opposed sides are sides oriented in planes substantially at right angles to said longitudinal axis, so that the baying of said data hall module with the open side of a like data hall module in end-to-end relationship is done at an interface plane that intersects said longitudinal axis.

10. The data hall module as claimed in any of claims 1 to 9, wherein utility services enter said data hall through an access port on at least one side of said second pair of opposed sides.

11. The data hall module as claimed in claim 1, wherein said data hall module has a shape, size and corner castings of an ISO standard shipping container.

12. The data hall module as claimed in claim 1, wherein said data module comprises high grade insulation.

13. The data hall module as claimed in claim 1, said module comprising: a heat capture device coupled to a refrigerant fluid circulating in a closed circuit through to a chilling device.

14. The data hall module, as claimed in claim 12, wherein said chilling device is internal of said data hall module.

15. The data hall module, as claimed in claim 12, wherein said chilling device is external of said data hall module.

16. The data hall module as claimed in any of claims 13 to 14, wherein said chilling device comprises an evaporator, at least a primary compressor, a condenser and an expansion valve; a heat recuperation means for recuperating at least a portion of the heat captured from IT equipment housed within said module; and a second thermal powered compressor operably powered by said at least a portion of the recuperated heat for supplementing the compressing of the refrigerant fluid carried out by said primary compressor.

* * * * *